(12) United States Patent
Wang et al.

(10) Patent No.: US 8,722,825 B2
(45) Date of Patent: May 13, 2014

(54) SURFACE ACTIVE ADDITIVE AND PHOTORESIST COMPOSITION COMPRISING SAME

(75) Inventors: Deyan Wang, Hudson, MA (US);
Chunyi Wu, Shrewsbury, MA (US);
Cong Liu, Shrewsbury, MA (US);
Gerhard Pohlers, Needham, MA (US);
Cheng-bai Xu, Southborough, MA (US); George G. Barclay, Jefferson, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 13/482,574

(22) Filed: May 29, 2012

(65) Prior Publication Data
US 2013/0137035 A1 May 30, 2013

Related U.S. Application Data

(60) Provisional application No. 61/490,825, filed on May 27, 2011.

(51) Int. Cl.
*C08F 226/06* (2006.01)
*C08F 214/18* (2006.01)
*C08F 220/34* (2006.01)

(52) U.S. Cl.
USPC ........... 526/265; 526/263; 526/243; 526/245; 526/248; 526/288; 526/328.5; 430/270.1; 430/907; 430/910

(58) Field of Classification Search
None
See application file for complete search history.

(56) References Cited

U.S. PATENT DOCUMENTS

| | | | |
|---|---|---|---|
| 3,927,199 A | 12/1975 | Micchelli et al. | |
| 5,997,853 A | 12/1999 | Bolich, Jr. et al. | |
| 2007/0142588 A1 | 6/2007 | Scherble et al. | |
| 2009/0104559 A1 | 4/2009 | Houlihan et al. | |
| 2010/0151388 A1* | 6/2010 | Yang et al. | 430/285.1 |
| 2012/0171612 A1* | 7/2012 | Satou et al. | 430/270.1 |
| 2012/0183904 A1 | 7/2012 | Sagehashi et al. | |

OTHER PUBLICATIONS

European Search Report dated Sep. 27, 2012; Application No. 12168948.3; 3 pages.

* cited by examiner

*Primary Examiner* — Sin J. Lee
(74) *Attorney, Agent, or Firm* — Cantor Colburn LLP

(57) ABSTRACT

A polymer comprises the polymerized product of monomers comprising a nitrogen-containing monomer comprising formula (Ia), formula (Ib), or a combination of formulas (Ia) and (Ib), and an acid-deprotectable monomer having the formula (II):

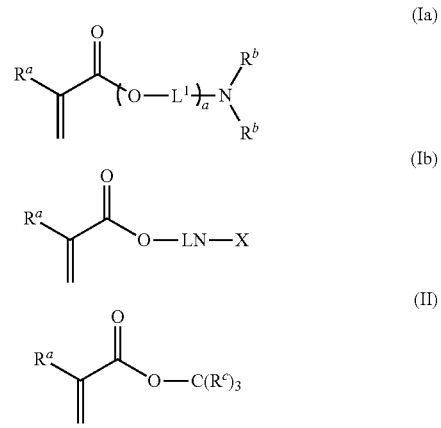

wherein a is 0 or 1, each $R^a$ is independently H, F, $C_{1-10}$ alkyl, or $C_{1-10}$ fluoroalkyl, $L^1$ is a straight chain or branched $C_{1-20}$ alkylene group, or a monocyclic, polycyclic, or fused polycyclic $C_{3-20}$ cycloalkylene group, each $R^b$ is independently H, $C_{1-10}$ alkyl, $C_{3-20}$ cycloalkyl, $C_{3-20}$ heterocycloalkyl, an aliphatic $C_{5-20}$ oxycarbonyl, or a $C_{1-30}$ acyl group optionally including a heteroatom substituent group, where each $R^b$ is separate or at least one $R^b$ is attached to an adjacent $R^b$; LN is a nitrogen-containing monocyclic, polycyclic, or fused polycyclic $C_{3-20}$ heterocycloalkylene group, and X is H, $C_{1-10}$ alkyl, aliphatic $C_{5-20}$ oxycarbonyl, or a $C_{1-30}$ acyl group optionally including a heteroatom substituent group; and each $R^c$ is independently $C_{1-10}$ alkyl, $C_{3-20}$ cycloalkyl, or $C_{3-20}$ heterocycloalkyl, wherein each $R^c$ is separate or at least one $R^c$ is attached to an adjacent $R^c$.

6 Claims, No Drawings

SURFACE ACTIVE ADDITIVE AND PHOTORESIST COMPOSITION COMPRISING SAME

CROSS-REFERENCE TO RELATED APPLICATION

This application is a nonprovisional of provisional U.S. application No. 61/490,825, filed on May 27, 2011, the contents of which are incorporated herein by reference in their entirety.

BACKGROUND

Immersion lithography at 193 nm has emerged as a useful technique for improving lithographic performance in a photoresist film by effectively increasing the numerical aperture (NA) of the exposure tool, thereby increasing the resolution that can be obtained from the photoresist. In immersion lithography, a film of water is in contact with the optics and the surface of a top coat coated on a photoresist film to be exposed. Photoresist formulations used in the film may, however, suffer from surface loss where some of the top coat may cause an unpredictable degree of top stripping, attributable to the strong interaction of acidic components in the top coat with acid sensitive components of the photoresist film.

To overcome this, surface active quenchers (i.e., bases) have been included in photoresist formulations. Excess base quencher in the surface layer of the photoresist film would mitigate the acid attack from the top coat and thus reduce the degree of top loss and help maintain good feature profile. Surface active quencher materials that have been used to enrich the surface layer of a photoresist film include fluorinated quencher bases and the base with long alkyl chains ($C_8$ or longer).

While such an approach has demonstrated some improvements in reduced top loss, adverse effects such as decreased lithographic performance and increased micro-bridge defects may occur. This is believed to be due to the hydrophobic nature of the surface active quencher materials, which are essentially insoluble in aqueous base developer or water. Furthermore, small quencher molecules may be readily washed away during the top coat process since such quencher materials are generally soluble in the solvent used to apply the top coat.

It is therefore desirable to have a photoresist formulated so that there is a concentrated quencher material distributed on the film surface and the region near the top surface, which does not adversely affect lithographic and development performance.

STATEMENT OF INVENTION

The above and other deficiencies of the prior art may be overcome by, in an embodiment, a polymer comprising the polymerized product of monomers comprising a nitrogen-containing monomer comprising formula (Ia), formula (Ib), or a combination of formulas (Ia) and (Ib), and an acid-deprotectable monomer having the formula (II):

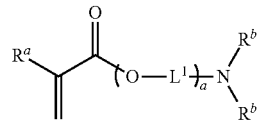
(Ia)

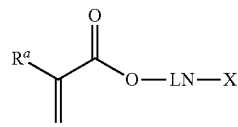
(Ib)

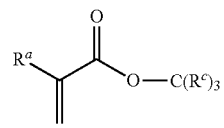
(II)

wherein a is 0 or 1, each $R^a$ is independently H, F, $C_{1-10}$ alkyl, or $C_{1-10}$ fluoroalkyl, $L^1$ is a straight chain or branched $C_{1-20}$ alkylene group, or a monocyclic, polycyclic, or fused polycyclic $C_{3-20}$ cycloalkylene group, each $R^b$ is independently H, $C_{1-10}$ alkyl, $C_{3-20}$ cycloalkyl, $C_{3-20}$ heterocycloalkyl, an aliphatic $C_{5-20}$ oxycarbonyl, or a $C_{1-30}$ acyl group optionally including a heteroatom substituent group, where each $R^b$ is separate or at least one $R^b$ is attached to an adjacent $R^b$; LN is a nitrogen-containing monocyclic, polycyclic, or fused polycyclic $C_{3-20}$ heterocycloalkylene group, and X is H, $C_{1-10}$ alkyl, aliphatic $C_{5-20}$ oxycarbonyl, or a $C_{1-30}$ acyl group optionally including a heteroatom substituent group; and each $R^c$ is independently $C_{1-10}$ alkyl, $C_{3-20}$ cycloalkyl, or $C_{3-20}$ heterocycloalkyl, wherein each $R^c$ is separate or at least one $R^c$ is attached to an adjacent $R^c$.

In another embodiment, a photoresist comprising an acid sensitive polymer comprising acid sensitive groups and lactone-containing groups, a photoacid generator, and a polymeric quencher comprising the polymerized product of a nitrogen-containing monomer comprising formula (Ia), formula (Ib), or a combination of formulas (Ia) and (Ib), and an acid-deprotectable monomer having the formula (II):

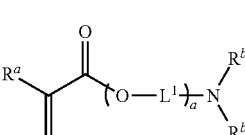
(Ia)

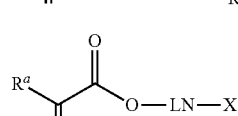
(Ib)

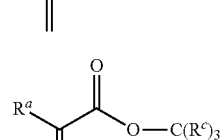
(II)

wherein a is 0 or 1; each $R^a$ is independently H, F, $C_{1-10}$ alkyl, or $C_{1-10}$ fluoroalkyl; $L^1$ is a straight chain or branched $C_{1-20}$ alkylene group, or a monocyclic, polycyclic, or fused polycyclic $C_{3-20}$ cycloalkylene group, each $R^b$ is independently H, $C_{1-10}$ alkyl, $C_{3-20}$ cycloalkyl, $C_{3-20}$ heterocycloalkyl, or an aliphatic $C_{5-20}$ oxycarbonyl, or a $C_{1-30}$ acyl group optionally including a heteroatom substituent group, where each $R^b$ is separate or at least one $R^b$ is attached to an adjacent $R^b$; LN is a nitrogen-containing monocyclic, polycyclic, or fused polycyclic $C_{3-20}$ heterocycloalkylene group, and X is H, $C_{1-10}$ alkyl, aliphatic $C_{5-20}$ oxycarbonyl, or $C_{1-30}$ acyl group optionally including a heteroatom substituent group; and each $R^c$ is independently $C_{1-10}$ alkyl, $C_{3-20}$ cycloalkyl, or $C_{3-20}$ heterocycloalkyl, wherein each $R^c$ is separate or at least one $R^c$ is attached to an adjacent $R^c$.

DETAILED DESCRIPTION

Disclosed herein is a polymeric quencher having surface activity for use in photoresist compositions, and in particular, photoresist compositions useful for 193 immersion lithography. The polymeric quencher includes monomeric units having nitrogen-containing functional groups that can scavenge free acid, and monomeric units having acid sensitive protective groups, which when exposed to acid, unmask a base-soluble functional group (such as, for example, a carboxylic acid). The acid sensitive protective groups also may have high lipophilicity to provide surface activity. The polymeric quencher may further include monomeric units having base solubility, and monomeric units having high lipophilicity for enhancing the surface activity. During coating, the polymeric quencher migrates to and enriches at the photoresist/air interface (i.e., the surface on which a top coat may be applied).

The polymeric quencher includes one or more compositional units that (1) have a low surface energy relative to the components of the photoresist in which it is included, so that the polymeric quencher stays at the top surface, (2) have developer solubility in the exposed areas, and (3) allow the polymeric quencher to remain substantially without loss at the top surface of the photoresist film during the top coat process.

The polymeric quencher includes the polymerized product of vinyl-containing monomers, including (meth)acrylamide and/or (meth)acrylate monomers. As used herein, "(meth)acrylamide" means acrylamides or methacrylamides or a combination comprising at least one of these polymerizable groups; likewise, "(meth)acrylate" means acrylate or methacrylate or a combination comprising at least one of these polymerizable groups. The monomers thus include a nitrogen-containing monomer having the formula (Ia) and/or (Ib), and an acid-deprotectable monomer having the formula (II):

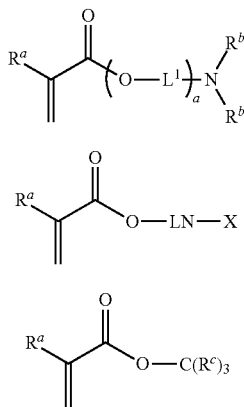

wherein, in formula (Ia), is 0 or 1.

Also in formulas (Ia), (Ib), and (II), each $R^a$ is independently H, F, $C_{1-10}$ alkyl, or $C_{1-10}$ fluoroalkyl. Preferably, $R^a$ is independently H, $C_{1-4}$ alkyl, or $CF_3$. Preferably, $R^a$ is H or $CH_3$.

In formula (Ia), where a is 1, $L^1$ is a linking group, and is independently a straight chain or branched $C_{1-20}$ alkylene group, or a monocyclic, polycyclic, or fused polycyclic $C_{3-20}$ cycloalkylene group. Exemplary such $L^1$ groups include 1,2-ethylene, 1,2-propylene, 1,3-propylene, 1-methyl-1,3-propylene, 2-methyl-1,3-propylene, 2,2-dimethyl-1,3-propylene, 2,2-diethyl-1,3-propylene, 1,4-butylene, 2,3-butylene, 1,5-pentylene, 1,6-hexylene, 1,2-cyclohexylene, 1,3-cyclohexylene, 1,4-cyclohexylene, 1,4-cyclohexyldimethylene, 2-hydroxy-1,3-propylene, 3-hydroxy-1,4-butylene, and 4-hydroxy-1,5-butylene.

Also in formula (Ia), each $R^b$ is independently H, $C_{1-10}$ alkyl, $C_{3-20}$ cycloalkyl, $C_{3-20}$ heterocycloalkyl, an aliphatic $C_{5-20}$ oxycarbonyl, or $C_{1-30}$ acyl group optionally including a heteroatom substituent group. Further, each $R^b$ is separate or at least one $R^b$ is attached to an adjacent $R^b$. In this way, formula (Ia) may also include cyclic amide groups (where a is 0) which incorporate two or more connected $R^b$ groups such as piperidines, piperazines, and morpholines attached to $L^1$ by a single C—N bond; or cyclic amine groups (where a is 1) which incorporate two or more connected $R^b$ groups such as those based on piperidines, piperazines, morpholines, and the like, and connected to $L^1$ by a single C—N bond.

In formula (Ib), LN is a nitrogen-containing monocyclic, polycyclic, or fused polycyclic $C_{3-20}$ heterocycloalkylene group, or a $C_{1-30}$ acyl group optionally including a heteroatom substituent group. Preferably, LN is a heterocycle attached by a hydroxy group to an ester carbonyl. The heterocycle may be, for example, 2-, 3-, and 4-piperidinyl, 2-piperazinyl, and 2- and 3-morpholinyl groups. Also in formula (Ib), X is H, $C_{1-10}$ alkyl, aliphatic $C_{5-20}$ oxycarbonyl, or a $C_{1-30}$ acyl group optionally including a heteroatom substituent group.

It will be appreciated that where $R^b$ or X is an aliphatic $C_{5-20}$ oxycarbonyl, such a group is acid sensitive and may decompose in the presence of acid to generate the corresponding secondary amine, which may in turn go on to form the quaternary ammonium salt.

Preferably, where in formula (Ib) X is an aliphatic $C_{5-20}$ oxycarbonyl, the nitrogen-containing monomer may have the formula (Ic):

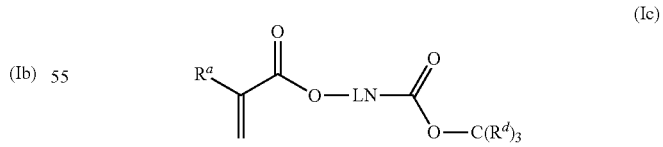

wherein, in formula (Ic), each $R^d$ is independently $C_{1-10}$ alkyl, $C_{3-20}$ cycloalkyl, or $C_{3-20}$ heterocycloalkyl, and each $R^d$ is separate or at least one $R^d$ is attached to an adjacent $R^d$. In one example, the tertiary group including $R^d$ is a t-butyl group. In another example, formula (Ic) may include cycloalkyl structures which incorporate two or more $R^d$ groups, such as 1-methylcyclopentyl, 1-ethylcyclopentyl, and 1-methylcyclohexyl, and the like.

In formula (Ic), LN is:

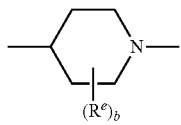

wherein each $R^e$ is independently H, halogen, OR', $C_{1-10}$ alkyl, or $C_{3-10}$ cycloalkyl, where R' is H or $C_{1-10}$ alkyl, and b is an integer of 1 to 9.

Preferably, the nitrogen-containing monomer is:

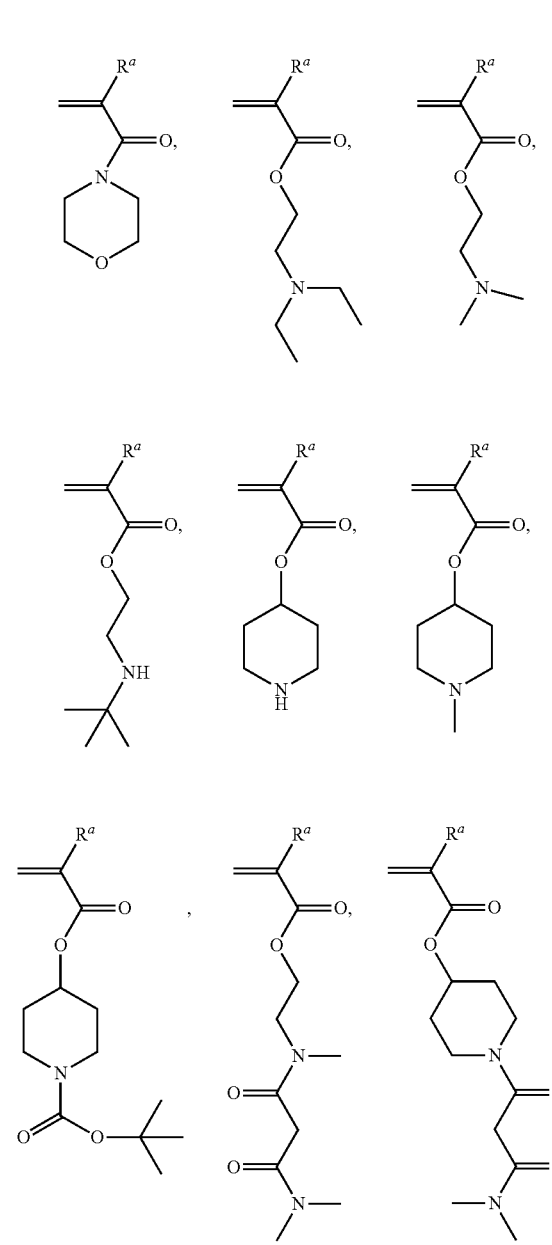

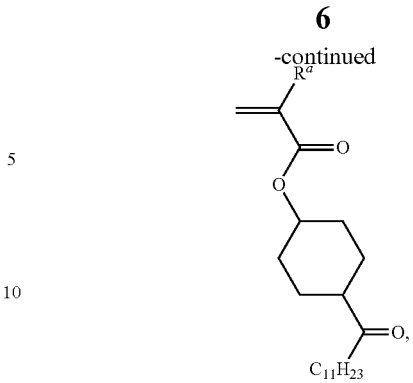

a reaction product of an epoxy-containing monomer of formula (III) with ammonia, a $C_{1-10}$ primary amine, or a $C_{2-20}$ secondary amine:

(III)

or a combination comprising at least one of the foregoing, wherein each $R^a$ is independently H or $C_{1-10}$ alkyl, and $L^2$ is a $C_{1-10}$ alkylene, $C_{3-10}$ cycloalkylene, or a $C_{3-10}$ ester-containing group.

Exemplary nitrogen-containing monomers include (meth) acrylamide and (meth)acrylate monomers derived from (meth)acrylic acid or a derivative thereof (such as the acid chloride, anhydride, an ester, etc.) or glycidyl(meth)acrylate and an amine including ammonia, methylamine, ethylamine, propylamine, butylamine, cyclohexylamine, N,N-dimethylamine, N,N-diethylamine, methyl ethyl amine, 2-hydroxyethylamine, 2-hydroxy-N-t-butyloxycarbonylaminoethane, 2-hydroxy-N,N-dimethylaminoethane, piperidine, piperazine, N-alkyl piperazines such as N-methylpiperazine and N-ethylpiperazine, morpholine, 4-hydroxycyclohexylamine, 4-hydroxypiperidine, N-t-butyloxycarbonyl-4-hydroxypiperidine, 4-hydroxy-N-methylpiperidine, 2-hydroxymethylpiperidine, 4-hydroxymethylpiperidine, 2-hydroxymethyl-N-methylpiperidine, 4-hydroxymethyl-N-methylpiperidine, and the like.

In formula (II), each $R^c$ is independently $C_{1-10}$ alkyl, $C_{3-20}$ cycloalkyl, or $C_{3-20}$ heterocycloalkyl, wherein each $R^c$ is separate or at least one $R^c$ is attached to an adjacent $R^c$.

In this way, formula (II) may also include a cycloalkyl group which incorporates two or more connected $R^c$ groups. In one example, the tertiary group including $R^c$ is thus a t-butyl group, a 2-(2,2,3,3-tetramethyl)propane, and the like. In another example, formula (II) may include cycloalkyl structures which incorporate two or more $R^c$ groups. In another specific example, the tertiary group including $R^c$ may include a cyclic group such as 1-methyl cyclopentyl, 1-ethylcyclopentyl, 1-methylcyclohexyl, and the like.

Preferably, the acid deprotectable monomer includes:

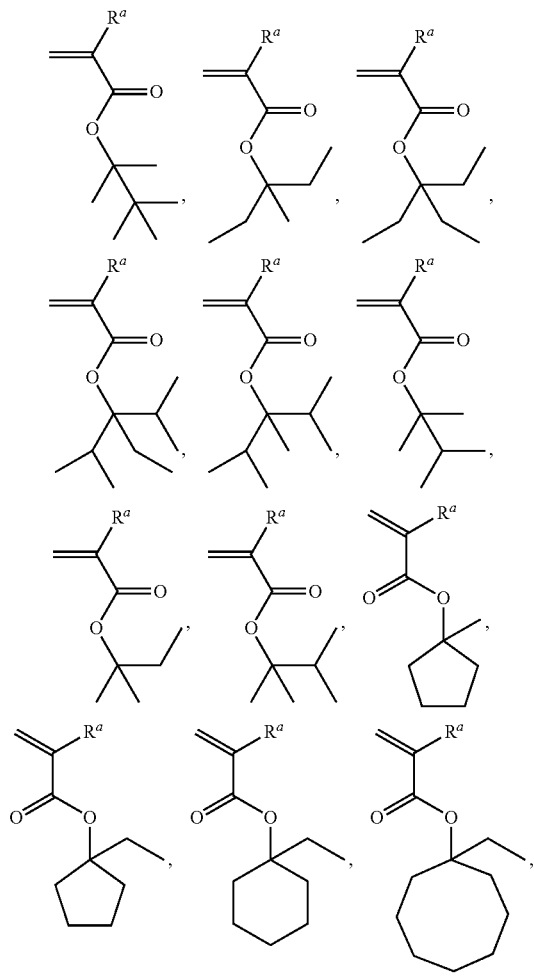

or a combination comprising at least one of the foregoing, wherein each $R^a$ is independently H or $C_{1-4}$ alkyl.

The polymer may further include the polymerized product of a base-soluble monomer. Useful base soluble monomers include functional groups having an acidic proton with a pKa of less than about 15, preferably less than about 12, and which may react with a base developer, such as, for example, 0.26 N aqueous tetramethylammonium hydroxide. Preferably, the base soluble monomer is of formula (IV):

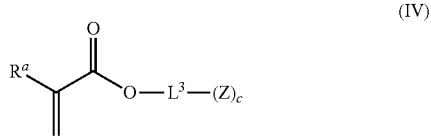

(IV)

wherein $R^a$ is H, F, $C_{1-10}$ alkyl, or $C_{1-10}$ fluoroalkyl, $L^3$ is a linear or branched $C_{1-20}$ alkylene, or $C_{3-20}$ cycloalkylene; and Z is:

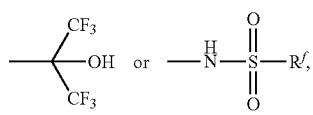

wherein $R^f$ is a $C_{1-4}$ perfluoroalkyl group, and c is an integer from 1 to 3.

Preferably, the base-soluble monomer may include:

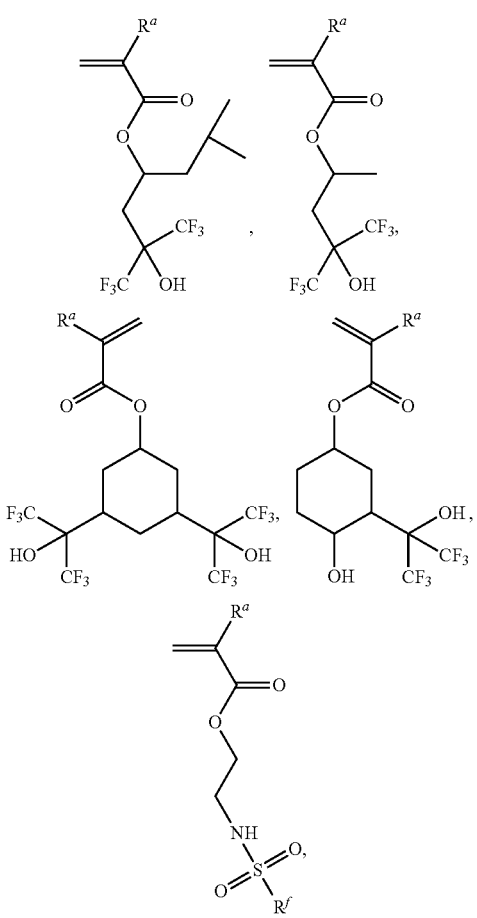

or a combination comprising at least one of the foregoing monomers, wherein $R^a$ is H, F, $C_{1-10}$ alkyl, or $C_{1-10}$ fluoroalkyl, and $R^f$ is a $C_{1-4}$ perfluoroalkyl group.

The polymer may further include the polymerized product of a surface-active monomer. Such surface active monomers may include alkyl, fluoroalkyl, or poly(alkylene oxide) moieties. Suitable surface active monomers may include those having formula (V):

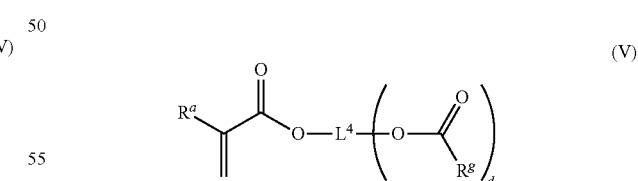

(V)

wherein $L^4$ is a d+1 valent $C_{2-20}$ alkylene group or $C_{3-20}$ cycloalkylene group, each $R^g$ is independently a $C_{1-22}$ alkyl, a $C_{1-4}$ fluoroalkyl, $-(O-(CR_3)_x)_y-R''$ where x is an integer of 2 to 10, y is an integer from 1 to 20, R'' is H, OH or a $C_{1-10}$ alkoxy group, and each $R^g$ is optionally substituted with a functional group comprising an ether group, ester group, ketone group, OH group, or combination comprising at least one of the foregoing functional groups, and d is an integer from 1 to 20.

Preferably, the surface active monomer of formula (V) may include:

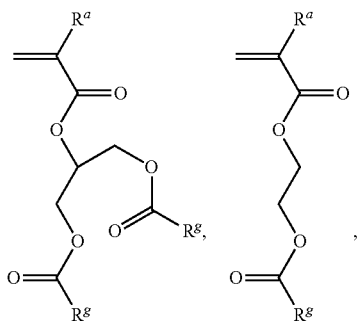

or a combination comprising at least one of the foregoing, wherein $R^a$ is H, F, $C_{1-10}$ alkyl, or $C_{1-10}$ fluoroalkyl, and each $R^g$ is independently a $C_{1-10}$ fluoroalkyl group.

Useful $R^g$ groups include those derived from long-chain carboxylic acids up to $C_{22}$, such as decanoic acid, dodecanoic acid, octadecanoic acid, eicosadecanoic acid, or the like; fluoroalkyl groups such as those derived from trifluoroacetic acid, 3,3,3-trifluoropropionic acid, 2,2,3,3,-tetrafluoropropionic acid, 2,2,3,3,3-pentafluoropropionic acid, perfluorobutanoic acid, and the like; and polyalkylene oxides such as those having ethylene oxide (EO) and/or propylene oxide (PO) repeating units including poly(ethylene oxide), poly(propylene oxide), and di- and tri-block EO-PO or EO-PO-EO copolymers such as PLURONIC® 25R2, L121, L123, L31, L81, L101 and P123 (BASF, Inc.).

The composition may be formulated as a photoresist formulation, which includes, in addition to the polymeric quencher disclosed herein, a photoresist polymer comprising an acid sensitive polymer comprising acid sensitive groups and lactone-containing groups; a photoacid generator including, for example, an onium salt such as a triphenyl sulfonium salt, nitrobenzyl ester, sulfonic acid esters, diazomethane derivatives, glyoxime derivatives, sulfonic acid ester derivatives of an N-hydroxyamide compound and halogen-containing triazine compounds; a solvent, and optionally an additive comprising an additional quencher, a surfactant, an embedded surface active additive, or a combination comprising at least one of the foregoing.

Solvents generally suitable for dissolving, dispensing, and coating the components include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Where an additional quencher is used, the quencher may include, for example, those based on hydroxides, carboxylates, amines, imines, and amides. Preferably, a useful quencher is an amine, an amide, or a combination comprising at least one of the foregoing. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines, amides and carbamates such as Troger's base, a hindered amine such as diazabicycloundecene (DBU) or diazabicyclononene (DBN), or ionic quenchers including quaternary alkyl ammonium salts such as tetrabutylammonium hydroxide (TBAH) or tetrabutyl ammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist composition may include the polymeric quencher in an amount of 0.1 to 10 wt %, specifically 0.5 to 9 wt %, and more specifically 1 to 8 wt %, based on the total weight of solids. The photoresist polymer may be included in an amount of 50 to 99 wt %, specifically 55 to 95 wt %, more specifically 60 to 90 wt %, and still more specifically 65 to 90 based on the total weight of solids. It will be understood that "photoresist polymer" may mean only the polymer, or a combination of the polymer with another polymer useful in a photoresist. The photoacid generator may be present in the photoresist in an amount of 0.01 to 20 wt %, specifically 0.1 to 15 wt %, and still more specifically 0.2 to 10 wt %, based on the total weight of solids. A surfactant may be included in an amount of 0.01 to 5 wt %, specifically 0.1 to 4 wt %, and still more specifically 0.2 to 3 wt %, based on the total weight of solids. An additional quencher may be included in relatively small amounts of for example, from 0 to 5 wt % based on the total weight of solids. Other additives may be included in amounts of less than or equal to 30 wt %, specifically less than or equal to 20%, or more specifically less than or equal to 10%, based on the total weight of solids. The total solids content for the photoresist composition may be 0.5 to 50 wt %, specifically 1 to 45 wt %, more specifically 2 to 40 wt %, and still more specifically 5 to 35 wt %, based on the total weight of solids and solvent. It will be understood that the solids includes copolymer, photoacid generator, quencher, surfactant, and any optional additives, exclusive of solvent.

Thus, preferably, a patternable film comprises a photoresist comprising the polymeric quencher, an acid sensitive polymer comprising acid sensitive groups and lactone-containing groups, a photoacid generator, and an additive.

The photoresist composition disclosed herein may be used to form a film comprising the photoresist, where the film on the substrate constitutes a coated substrate. Such a coated substrate includes: (a) a substrate having one or more layers to be patterned on a surface thereof; and (b) a layer of the photoresist composition over the one or more layers to be patterned. Preferably, patterning is carried out using ultraviolet radiation at wavelength of less than 248 nm, and in particular, at 193 nm.

Substrates may be any dimension and shape, and are preferably those useful for photolithography, such as silicon, silicon dioxide, silicon-on-insulator (SOI), strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layer on the substrates for semiconductor manufacture. Such substrates may preferably include silicon, SOI, strained silicon, and other such substrate materials, formed as circular wafers having dimensions such as, for example, 200 mm, 300 mm, or larger in diameter, or other dimensions useful for wafer fabrication production.

The invention is further illustrated by the following examples. All compounds and reagents used herein are available commercially except where a procedure is provided below.

All polymers were prepared by the general synthesis method as follows. Propylene glycol monomethyl ether acetate (PGMEA, 20.0 g) was added to a reaction vessel and heated to 85° C. A solution of monomers (total 10 g) and TRIGONOX 23-W50 peroxide initiator (0.16 g) in PGMEA (10.0 g) was cooled to less than 5° C. and added dropwise to the reaction vessel over 90 min. The reaction mixture was maintained at 85° C. for 5 h. then cooled to room temperature. The polymer solution was used without purification.

The monomers used in the preparation of the Examples 1-6 are shown below:

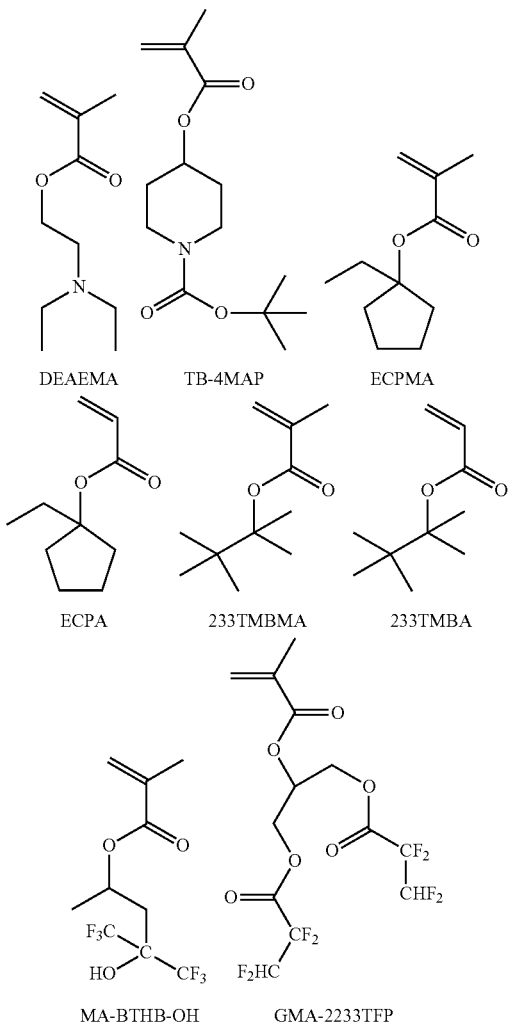

The polymers for Examples 1-6 and their compositions are listed in Table 1, below.

dure. A solution of 1-isopropyl-adamantanyl methacrylate (IAM) (20 mmol), 1-ethylcyclopentyl methacrylate (ECPMA) (20 mmol), 2-oxo-tetrahydro-furan-3-yl methacrylate (α-GBLMA) (30 mmol), 3-oxo-4,10-dioxa-tricyclo [5.2.1.02,6]dec-8(or 9)-yl methacrylate (ODOTMA) (20 mmol), and 3-hydroxy-adamantanyl methacrylate (HAMA) (10 mmol) dissolved in 30 g of tetrahydrofuran (THF) is degassed by bubbling with nitrogen and charged to a 500 ml flask equipped with a condenser, nitrogen inlet and mechanical stirrer along with an additional 10 g of degassed THF. The solution is brought to reflux, and 5 g of dimethyl-2,2-azodiisobutyrate is dissolved in 5 g of THF and charged in to the flask. The polymerization mixture is then stirred for about 4 hours at reflux, after which time the reaction is diluted with 5 g of THF and the polymerization mixture cooled to room temperature. The polymer is precipitated by addition to 1.0 L of isopropanol, collected by filtration, re-precipitated by dissolving in 50 g THF and addition to another 1.0 L isopropanol, and collected and dried under vacuum at 45° C. for 48 h. to yield photoresist polymer poly(IAM/ECPMA/α-GBLMA/ODOTMA/HAMA). Mw=9,000.

Water contact angle measurements for the above polymers of Examples 1-5 and a control according to the following method. The polymer solution was added to a photoresist solution (TG R396, available from Dow Electronic Materials) at 3% solids relative to the photoresist solids and filtered through a 0.2 μm filter.

The modified photoresist was then coated to a thickness of 110 nm at a spin speed of 1500 rpm on 84 nm of antireflective (AR™77, available from Dow Electronic Materials) coated on a 200 mm silicon wafer, and baked at 120° C./60 sec. A control example of the photoresist without a polymeric quencher was coated in the same way. The water contact angles were then measured on these coated wafers using a KRÜSS DSA Measurement Tool, and are reported in units of degrees (°).

Surface energy was determined for the polymers of Examples 1-5 and a control according to the following method. The polymeric quencher polymers of Examples 1-5 were added to a photoresist formulation (TG R396, available from Dow Electronic Materials) at 4% solids relative to photoresist solids, in 50/50 (w/w) PGMEA/2-heptanone. The modified photoresists were coated to a thickness of 110 nm at a spin speed of 1500 rpm on 84 nm of antireflective (AR™40, available from Dow Electronic Materials) coated on a 200 mm silicon wafer, and baked at 90° C./60 sec. A control example of the photoresist without a polymeric quencher was coated in the same way. Contact angle was measured on a KRÜSS DSA Measurement Tool by the Sessile Drop method using water (18 ohm deionized water), methylene iodide ($CH_2I_2$), and diethylene glycol. Surface energy including both polar and dispersive components was calculated from

TABLE 1

| Example | DEAEMA (mol %) | TB-4MAP (mol %) | 233TMBMA (mol %) | 233TMBA (mol %) | ECPMA (mol %) | ECPA (mol %) | MA-BTHB-OH (mol %) | GMA-2233TFP (mol %) |
|---|---|---|---|---|---|---|---|---|
| Ex. 1 | 20 | — | — | 60 | — | — | 20 | — |
| Ex. 2 | 14 | — | — | 66 | — | — | 24 | — |
| Ex. 3 | 20 | — | — | — | 43 | — | 37 | — |
| Ex. 4 | 25 | — | — | 29 | 23 | — | 23 | — |
| Ex. 5 | 26 | — | 23 | — | 28 | — | — | — |
| Ex. 6 | — | 10 | — | — | — | 6 | — | 84 |

A photoresist polymer for use in the lithographic evaluations (below) is prepared according to the following procethe contact angles of each of these solvents using extended Fowke's method (a variant of the Owens-Wendt method)

The water contact angle and surface energy results are reported in Table 2, below.

TABLE 2

| | Water Contact Angle (degrees, °) | Surface Energy (SE) (mN/m) |
|---|---|---|
| Control | 68.5 | 60.89 |
| Example 1 | 82.0 | 36.79 |
| Example 2 | 85.4 | 34.19 |
| Example 3 | 81.5 | 35.96 |
| Example 4 | 85.7 | 35.90 |
| Example 5 | 85.3 | 36.23 |

As seen in Table 2, water contact angles for the control were reduced by at least 13° (comparing the control with Example 3). In addition, the surface energy for Example 2 at 34.19 mN/m was about 44% lower than that of the control at 60.89 mN/m (a reduction of 26.7 mN/m). It is thus seen that at least a portion of the polymeric quencher is present at the surface of the photoresist, sufficient to increase the contact angle and reduce the surface energy.

The polymeric quenchers were tested for lithographic performance to determine the effect on lithographic processes and photoresist performance. Photoresist formulations including a photoresist polymer, photoacid generator (PAG), base (N-(n-dodecyl)diethanolamine), and surface leveling agent (SLA) (POLYFOX PF-656 surfactant, available from Omnova), and solvents propylene glycol monomethyl ether acetate (PGMEA) and methyl 2-hydroxybutyrate (HBM) were prepared by combining the above components and filtering (0.2 μm). The formulation for lithographic example 1 (LE1) also included polymeric quencher, where the control example (LE2) did not include a quencher. The photoresist formulations for the lithographic evaluation are shown in Table 3, below.

TABLE 3

| Lithographic Example | Photoresist Polymer | Polymeric Quencher | PAG$^a$ | base | SLA | Solvent |
|---|---|---|---|---|---|---|
| 1 | 0.53 g | Example 1 (0.02 g) | 0.077 g | 0.011 g | 0.6 mg | PGMEA (6.47 g) HBM (7.91 g) |
| 2 (Control) | 0.53 g | — | 0.077 g | 0.009 g | 0.6 mg | PGMEA (6.47 g) HBM (7.91g) |

$^a$PAG for Lithographic Example 1: tert-butylphenyldiphenylsulfonium (adamantan-1-yl methoxycarbonyl)-difluoro-methanesulfonate); PAG for Lithographic Example 2: triphenylsulfonium (3-hydroxyadamantan-l-yl methoxycarbonyl)-difluoro-methanesulfonate).

The photoresists were coated on a 200 mm silicon substrate previously coated with 84 nm of an antireflective coating (AR™77, available from Dow Electronic Materials), processed at 205° C./60 sec. The photoresist was applied and baked at a temperature of 95° C./60 sec. to a thickness of 120 nm using a TEL ACT-8 coating track, and exposed on an ASML/1100 193 nm stepper operating at 0.75 NA using annular illumination (0.89/0.64) and a reticle exposing 85 nm trenches at 1:1 pitch. After exposure, the wafers were post-exposure baked (PEB) at 95° C./60 sec., then developed using an aqueous developer (MF-26A, available from Dow Electronic Materials) for 30 seconds with prewet.

The lithographic results were determined for photospeed at size ($E_s$, in millijoules per square centimeter, mJ/cm$^2$), line edge roughness (LER, in nm), and critical dimension (CD, in nm). Linewidth and line edge roughness (LER) were determined by top-down scanning electron microscopy (SEM) using a Hitachi 9380 CD-SEM, operating at an accelerating voltage of 800 volts (V), probe current of 8.0 picoamperes (pA), using 200 K× magnification at 1.0 digital zoom, with the number of frames set to 64. LER was measured over a 2 μm line length in steps of 40 nm, and reported as the average for the measured region. The lithographic results are summarized in Table 4, below.

TABLE 4

| Lithographic Example | 1 | 2 (Control) |
|---|---|---|
| Es (mJ/cm$^2$) | 45.3 | 53.2 |
| LER (nm) | 6.8 | 5.5 |
| CD (nm) | 86.3 | 83.2 |

As seen in Table 4, while there was a small increase in line edge roughness (LER) of 1.3 nm, and slight decrease in resolution (CD) between Lithographic Example 1 (LE1) than for the control (LE2), the photospeed (Es) was significantly faster (7.9 mJ/cm$^2$) for Lithographic Example 1 (LE1) than for the control (LE2), indicating minimal loss of acid, and hence improved photospeed, with use of the polymeric quencher.

All ranges disclosed herein are inclusive of the endpoints, and the endpoints are independently combinable with each other. The suffix "(s)" as used herein is intended to include both the singular and the plural of the term that it modifies, thereby including at least one of that term. "Optional" or "optionally" means that the subsequently described event or circumstance can or cannot occur, and that the description includes instances where the event occurs and instances where it does not. As used herein, "combination" is inclusive of blends, mixtures, alloys, or reaction products. All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

The invention claimed is:

1. A polymer, comprising the polymerized product of monomers comprising:

a nitrogen-containing monomer having the formula (Ic), and an acid-deprotectable monomer having the formula (II):

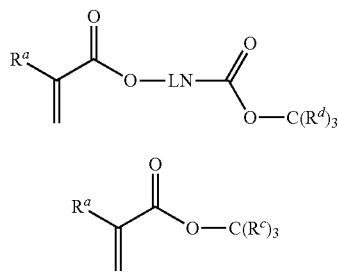

wherein:
each $R^a$ is independently H, F, $C_{1-10}$ alkyl, or $C_{1-10}$ fluoroalkyl;
LN is

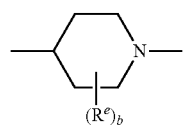

wherein each $R^e$ is independently halogen or OR', where R' is H or $C_{1-10}$ alkyl, and b is an integer of 1 to 9;
each $R^c$ is independently $C_{1-10}$ alkyl, $C_{3-20}$ cycloalkyl, or $C_{3-20}$ heterocycloalkyl, wherein each $R^c$ is separate or at least one $R^c$ is attached to an adjacent $R^c$; and
each $R^d$ is independently $C_{1-10}$ alkyl, $C_{3-20}$ cycloalkyl, or $C_{3-20}$ heterocycloalkyl, and each $R^d$ is separate or at least one $R^d$ is attached to an adjacent $R^d$.

2. A polymer, comprising the polymerized product of monomers comprising:
a nitrogen-containing monomer having the formula (Ic), and an acid-deprotectable monomer having the formula (II):

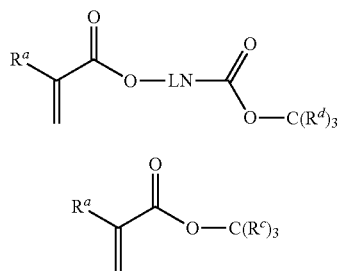

wherein:
each $R^a$ is independently H, F, $C_{1-10}$ alkyl, or $C_{1-10}$ fluoroalkyl;
LN is

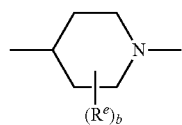

wherein each $R^e$ is independently halogen or OR', where R' is H or $C_{1-10}$ alkyl, and b is an integer of 1 to 9;

each $R^c$ is independently $C_{1-10}$ alkyl, $C_{3-20}$ cycloalkyl, or $C_{3-20}$ heterocycloalkyl, wherein each $R^c$ is separate or at least one $R^c$ is attached to an adjacent $R^c$; and
each $R^d$ is independently $C_{1-10}$ alkyl, $C_{3-20}$ cycloalkyl, or $C_{3-20}$ heterocycloalkyl, and each $R^d$ is separate or at least one $R^d$ is attached to an adjacent $R^d$; and
wherein the acid deprotectable monomer of formula (II) is

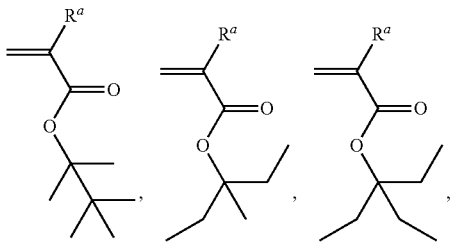

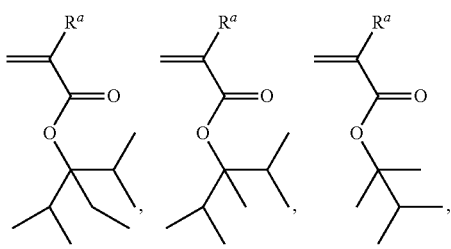

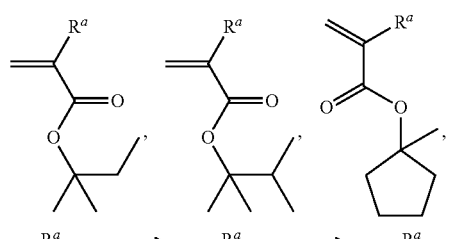

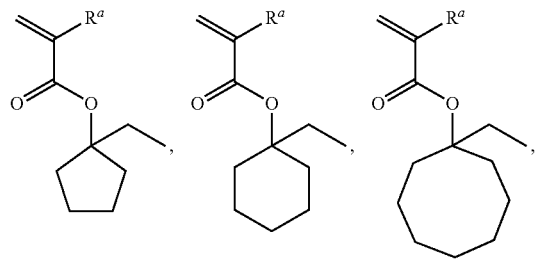

or a combination comprising at least one of the foregoing, wherein each $R^a$ is independently H or $C_{1-4}$ alkyl.

3. A polymer, comprising the polymerized product of monomers comprising:
a nitrogen-containing monomer having the formula (Ic), an acid-deprotectable monomer having the formula (II), and a base-soluble monomer of formula (IV):

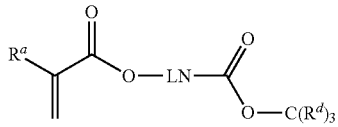

-continued

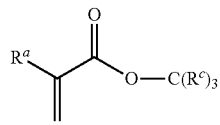
(II)

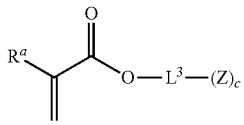
(IV)

wherein
R$^a$ is H, F, C$_{1-10}$ alkyl, or C$_{1-10}$ fluoroalkyl,
LN is

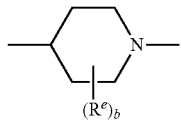

wherein each R$^e$ is independently halogen, OR', C$_{1-10}$ alkyl, or C$_{3-10}$ cycloalkyl, where R' is H or C$_{1-10}$ alkyl, and b is an integer of 1 to 9;
each R$^c$ is independently C$_{1-10}$ alkyl, C$_{3-20}$ cycloalkyl, or C$_{3-20}$ heterocycloalkyl, wherein each R$^c$ is separate or at least one R$^c$ is attached to an adjacent R$^c$; and
each R$^d$ is independently C$_{1-10}$ alkyl, C$_{3-20}$ cycloalkyl, or C$_{3-20}$ heterocycloalkyl, and each R$^d$ is separate or at least one R$^d$ is attached to an adjacent R$^d$;
L$^3$ is a linear or branched C$_{1-20}$ alkylene, or C$_{3-20}$ cycloalkylene; and
Z is

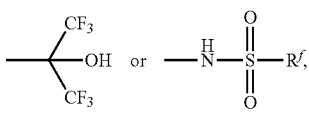

wherein R$^f$ is a C$_{1-4}$ perfluoroalkyl group; and
c is an integer from 1 to 3.

4. The polymer of claim 3, wherein the base-soluble monomer is:

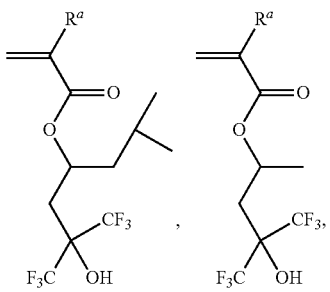

-continued

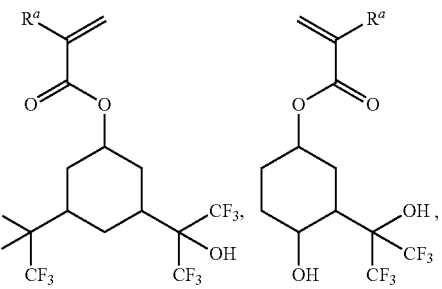

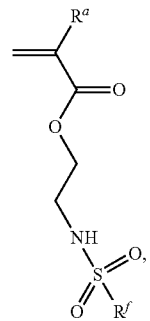

or a combination comprising at least one of the foregoing monomers,
wherein R$^a$ is H, F, C$_{1-10}$ alkyl, or C$_{1-10}$ fluoroalkyl, and R$^f$ is a C$_{1-4}$ perfluoroalkyl group.

5. A polymer comprising the polymerized product of monomers comprising: a nitrogen-containing monomer having the formula (Ic), an acid-deprotectable monomer having the formula (II), and a surface-active monomer of formula (V):

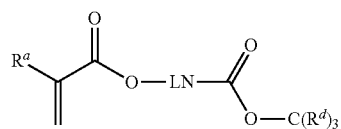
(Ic)

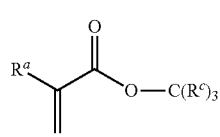
(II)

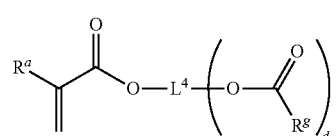
(V)

wherein
each R$^a$ is independently H, F, C$_{1-10}$ alkyl, or C$_{1-10}$ fluoroalkyl;

LN is

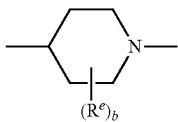

wherein each $R^e$ is independently H, halogen, OR', $C_{1-10}$ alkyl, or $C_{3-10}$ cycloalkyl, where R' is H or $C_{1-10}$ alkyl, and b is an integer of 1 to 9;

each $R^c$ is independently $C_{1-10}$ alkyl, $C_{3-20}$ cycloalkyl, or $C_{3-20}$ heterocycloalkyl, wherein each $R^c$ is separate or at least one $R^c$ is attached to an adjacent $R^c$; and each $R^d$ is independently $C_{1-10}$ alkyl, $C_{3-20}$ cycloalkyl, or $C_{3-20}$ heterocycloalkyl, and each $R^d$ is separate or at least one $R^d$ is attached to an adjacent $R^d$;

$L^4$ is an d+1 valent $C_{2-20}$ alkylene group or $C_{3-20}$ cycloalkylene group;

each $R^g$ is independently a $C_{1-22}$ alkyl or a $C_{1-4}$ fluoroalkyl, and each $R^g$ is optionally substituted with a functional group comprising an ether group, ester group, ketone group, OH group, or combination comprising at least one of the foregoing functional groups; and d is an integer from 1 to 20.

6. The polymer of claim 5, wherein the surface active monomer of formula (V) is

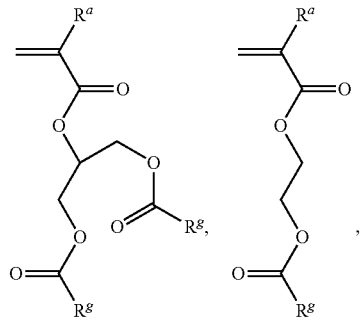

or a combination comprising at least one of the foregoing, wherein $R^a$ is H, F, $C_{1-10}$ alkyl, or $C_{1-10}$ fluoroalkyl, and each $R^g$ is independently a $C_{1-4}$ fluoroalkyl group.

* * * * *